United States Patent
Liu et al.

(10) Patent No.: US 10,379,157 B2
(45) Date of Patent: Aug. 13, 2019

(54) TEST PAD AND METHOD FOR DETERMINING POSITIONS OF PROBES

(71) Applicants: Fu Tai Hua Industry (Shenzhen) Co., Ltd., Shenzhen (CN); HON HAI PRECISION INDUSTRY CO., LTD., New Taipei (TW)

(72) Inventors: Eddy Liu, New Taipei (TW); Wei-Da Yang, New Taipei (TW); Xiao-Feng Hou, Shenzhen (CN); Guo-Dong Liang, Shenzhen (CN)

(73) Assignees: Fu Tai Hua Industry (Shenzhen) Co., Ltd., Shenzhen (CN); HON HAI PRECISION INDUSTRY CO., LTD., New Taipei (TW)

( * ) Notice: Subject to any disclaimer, the term of this patent is extended or adjusted under 35 U.S.C. 154(b) by 34 days.

(21) Appl. No.: 15/705,386

(22) Filed: Sep. 15, 2017

(65) Prior Publication Data
US 2018/0275191 A1  Sep. 27, 2018

(30) Foreign Application Priority Data

Mar. 27, 2017 (CN) .......................... 2017 1 0188413

(51) Int. Cl.
*G01R 31/28* (2006.01)

(52) U.S. Cl.
CPC ..... *G01R 31/2891* (2013.01); *G01R 31/2818* (2013.01); *G01R 31/2884* (2013.01)

(58) Field of Classification Search
None
See application file for complete search history.

(56) References Cited

U.S. PATENT DOCUMENTS

| | | | |
|---|---|---|---|
| 2007/0090851 A1* | 4/2007 | Kim ................... | G01R 1/06794 324/750.3 |
| 2009/0160470 A1* | 6/2009 | Reinwald ........... | G01R 31/2884 324/756.01 |
| 2012/0068725 A1* | 3/2012 | Pagani ............... | G01R 1/06794 324/750.16 |

* cited by examiner

Primary Examiner — Clayton E. LaBalle
Assistant Examiner — Jas A Sanghera
(74) Attorney, Agent, or Firm — ScienBiziP, P.C.

(57) ABSTRACT

A system for determining a position of a test probe of a test fixture applied to a test pad on a dummy board is disclosed. The test pad includes conductive test zones, resistors, a first insulating zone, and a plurality of second insulating zones. Each resistor has a different resistance. Each resistor is connected to a different test zone. The test zones include a first test zone and a surrounding plurality of second test zones. The first test zone is insulated from the second test zones by the first insulating zone. Adjacent second test zones are insulated from each other by a different second insulating zone. Probe correction can be carried out according to the value of resistance read by a resistance measuring device which stores a correspondence table, and position of the probe adjusted accordingly.

13 Claims, 5 Drawing Sheets

← 41

| Resistance value | Probe position | Correction indication |
|---|---|---|
| First resistance value | Zone 1 | First correction indication |
| Second resistance value | Zone 2 | Second correction indication |
| ...... | ...... | ...... |

FIG. 5

TEST PAD AND METHOD FOR DETERMINING POSITIONS OF PROBES

CROSS REFERENCE TO RELATED APPLICATION

This application claims priority to Chinese Patent Application No. 201710188413.0, filed Mar. 27, 2017, the disclosure of which is incorporated herein by reference in its entirety.

FIELD

The present disclosure relates to probe correction, and more particularly to a test pad and method for determining positions of probes, for accurate and effective probe function.

BACKGROUND

It is difficult for technicians to know direction and distance of probe offset when probes of a test fixture are offset, such that probe correction is difficult to carry out.

BRIEF DESCRIPTION OF THE DRAWINGS

Many aspects of the disclosure can be better understood with reference to the following drawings. The components in the drawings are not necessarily drawn to scale, the emphasis instead being placed upon clearly illustrating the principles of the disclosure. Moreover, in the drawings, like reference numerals designate corresponding parts throughout the several views.

FIG. 5 is a schematic diagram of a correspondence table.

DETAILED DESCRIPTION

Figure 1:
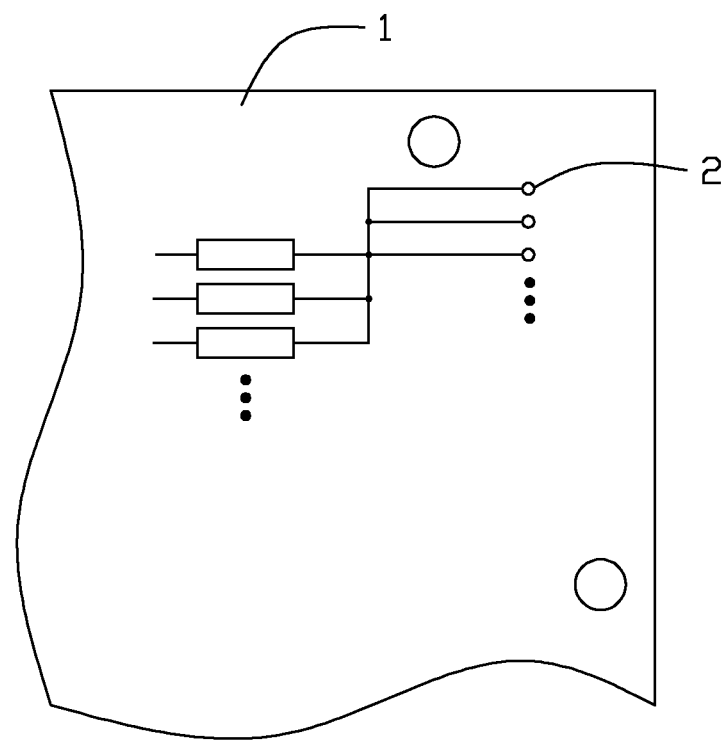
FIG. 1 is a partial schematic view of a dummy board with a test pad for determining positions of probes.

It will be appreciated that for simplicity and clarity of illustration, where appropriate, reference numerals have been repeated among the different figures to indicate corresponding or analogous elements. In addition, numerous specific details are set forth in order to provide a thorough understanding of the exemplary embodiments described herein. However, it will be understood by those of ordinary skill in the art that the exemplary embodiments described herein can be practiced without these specific details. In other instances, methods, procedures, and components have not been described in detail so as not to obscure the related relevant feature being described. Also, the description is not to be considered as limiting the scope of the exemplary embodiments described herein. The drawings are not necessarily to scale and the proportions of certain parts may be exaggerated to better illustrate details and features of the present disclosure.

Figure 2:
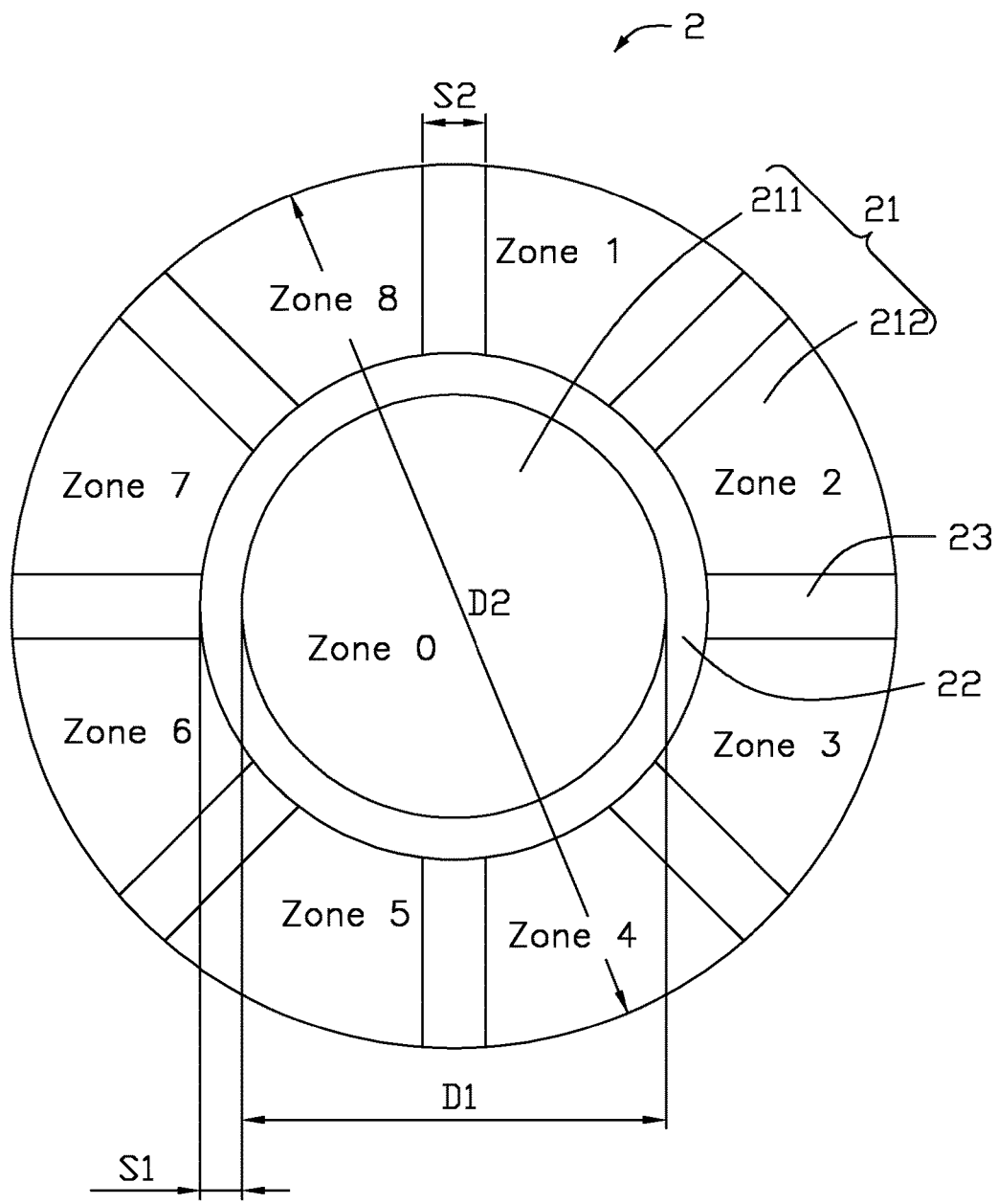
FIG. 2 is an enlarged schematic view of the test pad of FIG. 1.
Figure 3:
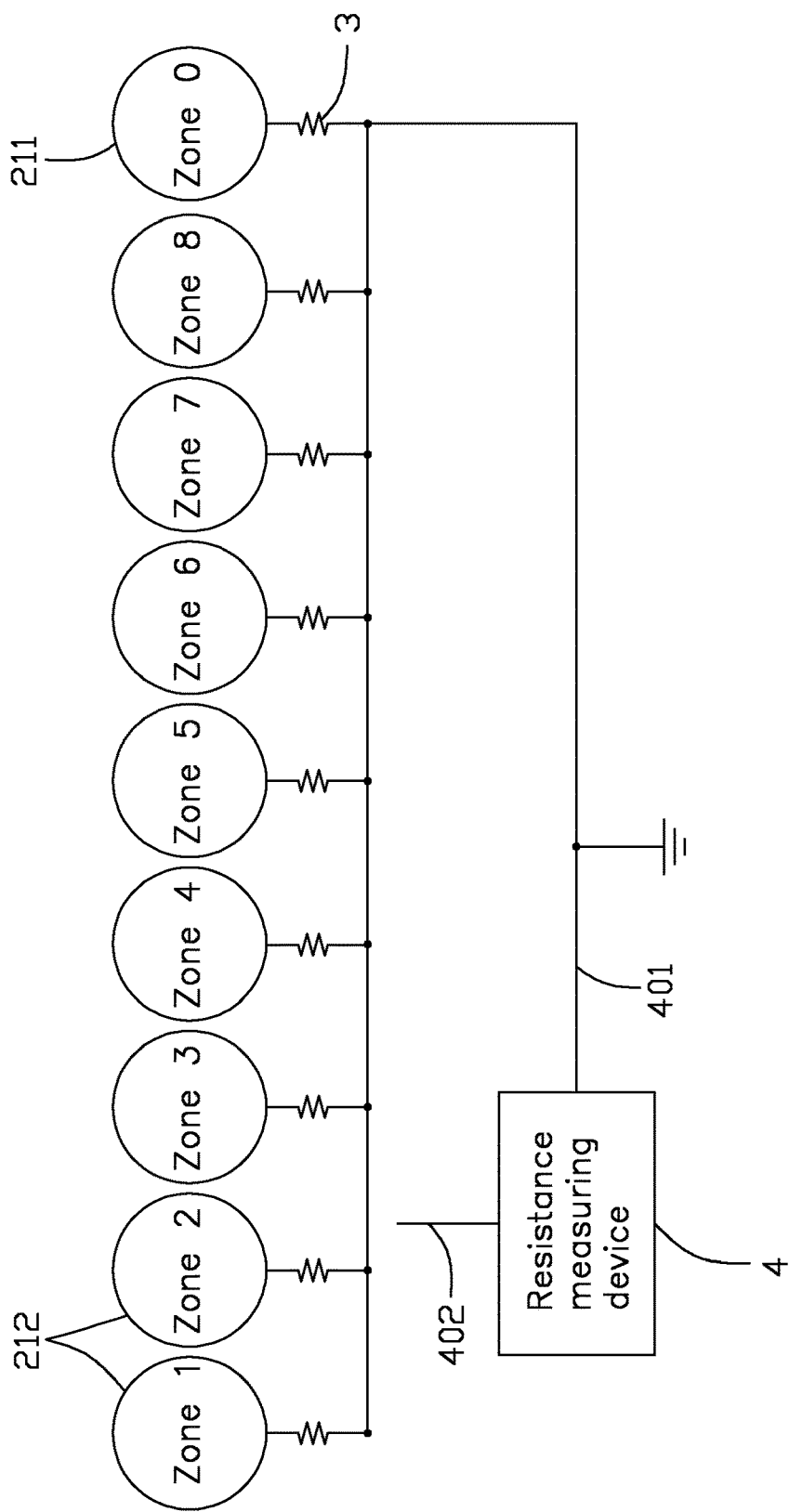
FIG. 3 is a block diagram of an environment in which a method for determining positions of probes may be implemented.

With reference to FIG. 1, an exemplary embodiment of a test pad 2 is provided on a dummy board 1, and a position of a probe of a test fixture can be determined. With reference to FIGS. 2 and 3, the test pad 2 includes a plurality of conductive test zones 21, a plurality of resistors 3, a first insulating zone 22, and a plurality of second insulating zones 23. Each one of the resistors 3 has a different resistance. Each one of the resistors 3 is connected to a different one of the test zones 21. The test zones 21 include a first test zone 211 and a plurality of second test zones 212. The second test zones 212 are disposed around the first test zone 211. The first test zone 211 is insulated from the second test zones 212 by the first insulating zone 22. Adjacent second test zones 212 are insulated from each other by a different one of the second insulating zones 23.

The present exemplary embodiment of the test pad 2 can determine the position of the probe with a diameter of 0.09-0.11 mm. The first test zone 211 is circular and has a diameter D1 of 0.28 mm. Each second test zone 212 has a shape of a sector of a circle. The second test zones 212 are disposed around the first test zone 211 at equal intervals to form a ring having an outer diameter D2 of 0.5 mm. The first insulating zone 22 is annular and has a thickness S1 of 0.07 mm. Each second insulating zone 23 is stripe-shaped and has a width S2 of 0.07 mm. The number of the second test zones 212 is eight, and the number of the resistors 3 is nine. One of the nine resistors 3 is connected to the one test zone 211 and each of the other eight resistors is connected to a second test zone 212.

When the probe is pressed against the test zone 21 of the test pad 2, the position of the probe can be determined by measuring the resistance of the resistor 3 connected to the pressed test zone 21. Therefore, probe correction can be carried out according to the determined position of the probe.

Figure 4:
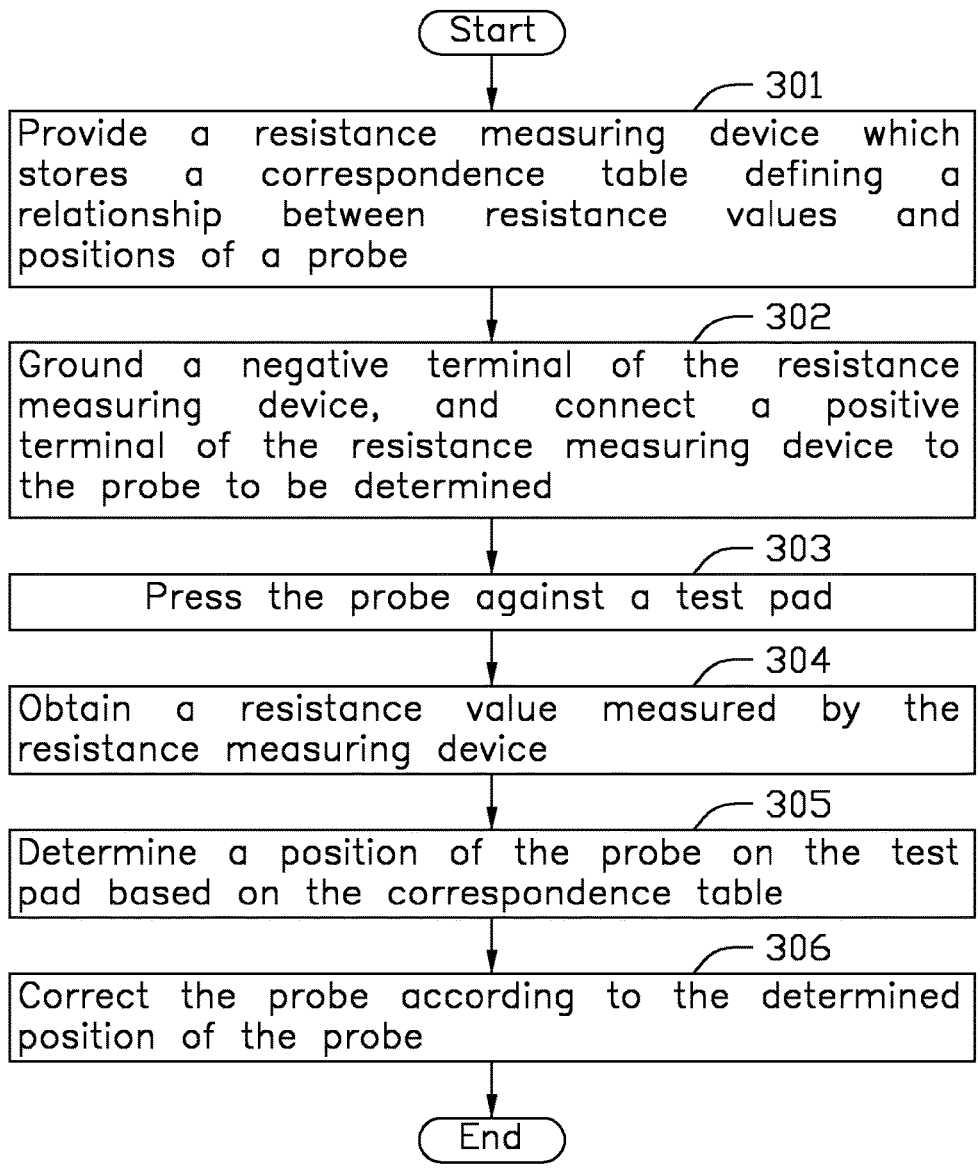
FIG. 4 is a flow diagram of the method for determining positions of probes.

With reference to FIG. 3, an exemplary embodiment of a method for determining positions of probes is implemented in an environment where the dummy board 1 with the test pad 2, a resistance measuring device 4, and the test fixture with the probe are available. With reference to FIG. 4, the present exemplary embodiment of the method is illustrated.

In step 301, the resistance measuring device 4 is provided. The device 4 stores a correspondence table 41 as shown in FIG. 5, and the correspondence table 41 defines a relationship between resistance values and probe positions.

In step 302, a negative terminal 401 of the resistance measuring device 4 is grounded, and a positive terminal 402 of the resistance measuring device 4 is connected to the target probe.

In step 303, the probe is pressed against the test pad 2.

In step 304, a resistance value measured by the resistance measuring device 4 is obtained.

In step 305, the position of the probe on the test pad 2 is determined based on the correspondence table 41.

In step 306, the probe can be corrected according to the established position of the probe. In detail, the probe is corrected if the determined position of the probe is not located in the first test zone 211 of the test pad 2, the probe is not corrected if the determined position of the probe is located in the first test zone 211 of the test pad 2. The correspondence table 41 further defines a relationship between the probe positions and correction indications. The correction indications include direction and distance information for moving the probe. The correction indication is determined based on the correspondence table 41, and the correction indication is then displayed on the resistance measuring device 4 such that the probe can be corrected according to the direction and distance information of the displayed correction indication.

The exemplary embodiments shown and described above are only examples. Many details are often found in the art such as the other features of a test pad and method for determining positions of probes. Therefore, many such details are neither shown nor described. Even though numerous characteristics and advantages of the present technology have been set forth in the foregoing description, together with details of the structure and function of the present disclosure, the disclosure is illustrative only, and changes may be made in the detail, especially in matters of shape, size, and arrangement of the parts within the principles of the present disclosure, up to and including the full extent established by the broad general meaning of the terms used in the claims. It will therefore be appreciated that the exemplary embodiments described above may be modified within the scope of the claims.

What is claimed is:

1. A test pad provided on a dummy board, and being used to determine a position of a probe of a test fixture, the test pad comprising:
    a plurality of conductive test zones, a plurality of resistors, a first insulating zone, and a plurality of second insulating zones;
    wherein each one of the resistors has a different resistance, and each one of the resistors is connected to a different one of the test zones;
    wherein the test zones comprise a first test zone and a plurality of second test zones, the second test zones are disposed around the first test zone, the first test zone is insulated from the second test zones by the first insulating zone, and adjacent second test zones are insulated from each other by a different one of the second insulating zones; and
    wherein the first test zone is circular and has a diameter of 0.28 mm.

2. The test pad of claim 1, wherein each second test zone has a shape of a sector of a circle, and the second test zones are disposed around the first test zone at equal intervals.

3. The test pad of claim 2, wherein the first insulating zone is annular, and each second insulating zone is stripe-shaped.

4. The test pad of claim 3, wherein the second test zones form a ring having an outer diameter of 0.5 mm.

5. The test pad of claim 4, wherein the first insulating zone has a thickness of 0.07 mm, and the second insulating zone has a width of 0.07 mm.

6. The test pad of claim 3, wherein the first insulating zone has a thickness of 0.07 mm, and the second insulating zone has a width of 0.07 mm.

7. The test pad of claim 2, wherein the second test zones form a ring having an outer diameter of 0.5 mm.

8. The test pad of claim 1, wherein the first insulating zone is annular, and each second insulating zone is stripe-shaped.

9. The test pad of claim 8, wherein the first insulating zone has a thickness of 0.07 mm, and the second insulating zone has a width of 0.07 mm.

10. The test pad of claim 1, wherein the number of the second test zones is eight, and the number of the resistors is nine.

11. A method for determining positions of probes comprising:
    providing a resistance measuring device which stores a correspondence table defining a relationship between resistance values and probe positions;
    grounding a negative terminal of the resistance measuring device, and connecting a positive terminal of the resistance measuring device to a target probe;
    pressing the probe against a test pad;
    obtaining a resistance value measured by the resistance measuring device;
    determining a position of the probe on the test pad based on the correspondence table; and
    correcting the probe according to the determined position of the probe;
    wherein the process of correcting the probe according to the determined position of the probe comprises:
        correcting the probe when the determined position of the probe is not located in a first test zone of the test pad, not correcting the probe when the determined position of the probe is located in the first test zone of the test pad; and
    wherein the first test zone is circular and has a diameter of 0.28 mm.

12. The method of claim 11,
    wherein the correspondence table further defines a relationship between the probe positions and correction indications; and
    wherein the process of correcting the probe according to the determined position of the probe comprises:
        determining the correction indication based on the correspondence table, and then displaying the correction indication on the resistance measuring device to enable the probe to be corrected.

13. The method of claim 12, wherein the correction indications comprise direction and distance information for moving the probe.

* * * * *